(12) United States Patent
Ker et al.

(10) Patent No.: US 7,626,647 B2
(45) Date of Patent: Dec. 1, 2009

(54) ELECTROSTATIC DISCHARGE PROTECTION STRUCTURE AND ELECTROSTATIC DISCHARGE PROTECTION DEVICE FOR A LIQUID CRYSTAL DISPLAY, AND METHOD OF MAKING THE SAME

(75) Inventors: Ming-Dou Ker, Hsinchu (TW); Chih-Kang Deng, Hsinchu (TW); Wein-Town Sun, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 154 days.

(21) Appl. No.: 11/894,577

(22) Filed: Aug. 21, 2007

(65) Prior Publication Data
US 2008/0094533 A1    Apr. 24, 2008

(30) Foreign Application Priority Data
Oct. 20, 2006    (TW) .............................. 95138797 A (51) Int. Cl.
G02F 1/1333    (2006.01)
H01L 21/332    (2006.01)
H01L 29/04    (2006.01)

(52) U.S. Cl. .............................. 349/40; 349/41; 349/59; 349/149; 349/152; 349/187; 349/192; 438/135; 257/E21.388; 257/E29.003

(58) Field of Classification Search ................... 349/40, 349/41, 56, 59, 149, 150, 152, 143–147, 349/187, 192; 257/E21.388, E29.003, 72, 257/59; 438/135
See application file for complete search history.

(56) References Cited

U.S. PATENT DOCUMENTS

| | | | |
|---|---|---|---|
| 6,043,971 A | 3/2000 | Song et al. .................. 361/111 |
| 6,175,394 B1 | 1/2001 | Wu et al. ....................... 349/40 |
| 6,493,047 B2 | 12/2002 | Ha ................................ 349/40 |
| 6,614,053 B1 * | 9/2003 | Takenaka ...................... 257/66 |
| 6,696,701 B2 * | 2/2004 | Hector et al. .................. 257/72 |
| 7,379,127 B2 * | 5/2008 | Tsao ............................. 349/40 |
| 2006/0145951 A1 * | 7/2006 | Watanabe et al. ............. 345/55 |
| 2007/0046845 A1 * | 3/2007 | Liou et al. ..................... 349/40 |
| 2007/0103423 A1 * | 5/2007 | Tsai et al. .................... 345/100 |
| 2008/0094533 A1 * | 4/2008 | Ker et al. ....................... 349/40 |

FOREIGN PATENT DOCUMENTS

JP    9 171167    6/1997    ............... 349/40 X

OTHER PUBLICATIONS

Chinese language Office Action dated Mar. 7, 2008.
Chinese language office action dated Aug. 22, 2008.
English language translation of abstract and pertinent parts of JP-9 171167.

* cited by examiner

*Primary Examiner*—Brian M Healy
(74) *Attorney, Agent, or Firm*—Thomas, Kayden, Horstemeyer & Risley (57) ABSTRACT

An electrostatic discharge protection device, an electrostatic discharge protection structure, and a manufacturing process of the device are provided. The electrostatic discharge protection device includes at least four doping regions, wherein two adjacent regions are of different types. The electrostatic discharge protection structure includes an electrostatic discharge bus, a plurality of first electrostatic discharge protection devices connecting to the gates of the display transistors and the electrostatic discharge bus, a plurality of second electrostatic discharge protection devices connecting to the source/drain of the transistors and the electrostatic discharge bus, and a plurality of third electrostatic discharge protection devices connecting to the input/output terminals of the drive circuit of the display and the electrostatic discharge bus.

8 Claims, 6 Drawing Sheets

ELECTROSTATIC DISCHARGE PROTECTION STRUCTURE AND ELECTROSTATIC DISCHARGE PROTECTION DEVICE FOR A LIQUID CRYSTAL DISPLAY, AND METHOD OF MAKING THE SAME

This application claims the benefit from the priority of Taiwan Patent Application No. 095138797 filed on Oct. 20, 2006, the disclosures of which are incorporated by reference herein in their entirety.

CROSS-REFERENCES TO RELATED APPLICATIONS

Not applicable.

BACKGROUND OF THE INVENTION

1. Field of the Invention

The present invention relates to an electrostatic discharge protection structure and device. In particular, the invention relates to an electrostatic discharge protection structure and device that provide electrostatic protection for a liquid crystal display.

2. Descriptions of the Related Art

An electrostatic discharge phenomenon occurs when electrostatic energy is released into electrical circuits, and thus, suddenly causing a high transient voltage and current. The high transient voltage and current may damage the electrical circuits including the internal circuits and the internal conducting wires. Consequently, the protection of the internal circuits and pixel arrays from electrostatic discharge has become a serious concern.

When the electrostatic discharge phenomenon occurs, a large amount of heat is generated in a short period of time due to its high voltage and high current. In a liquid crystal display, due to the low coefficient of heat conductivity in the glass substrate, the heat generated by the electrostatic discharge phenomenon can not be conducted efficiently via the substrate within a short period of time. Consequently, if the electrostatic discharge current releases energy through high resistance paths rather than low resistance paths within a short period of time, the over-generated heat, without efficient dissipation, will damage devices on the display due to the large voltage drop in high resistance paths.

Figure 1:
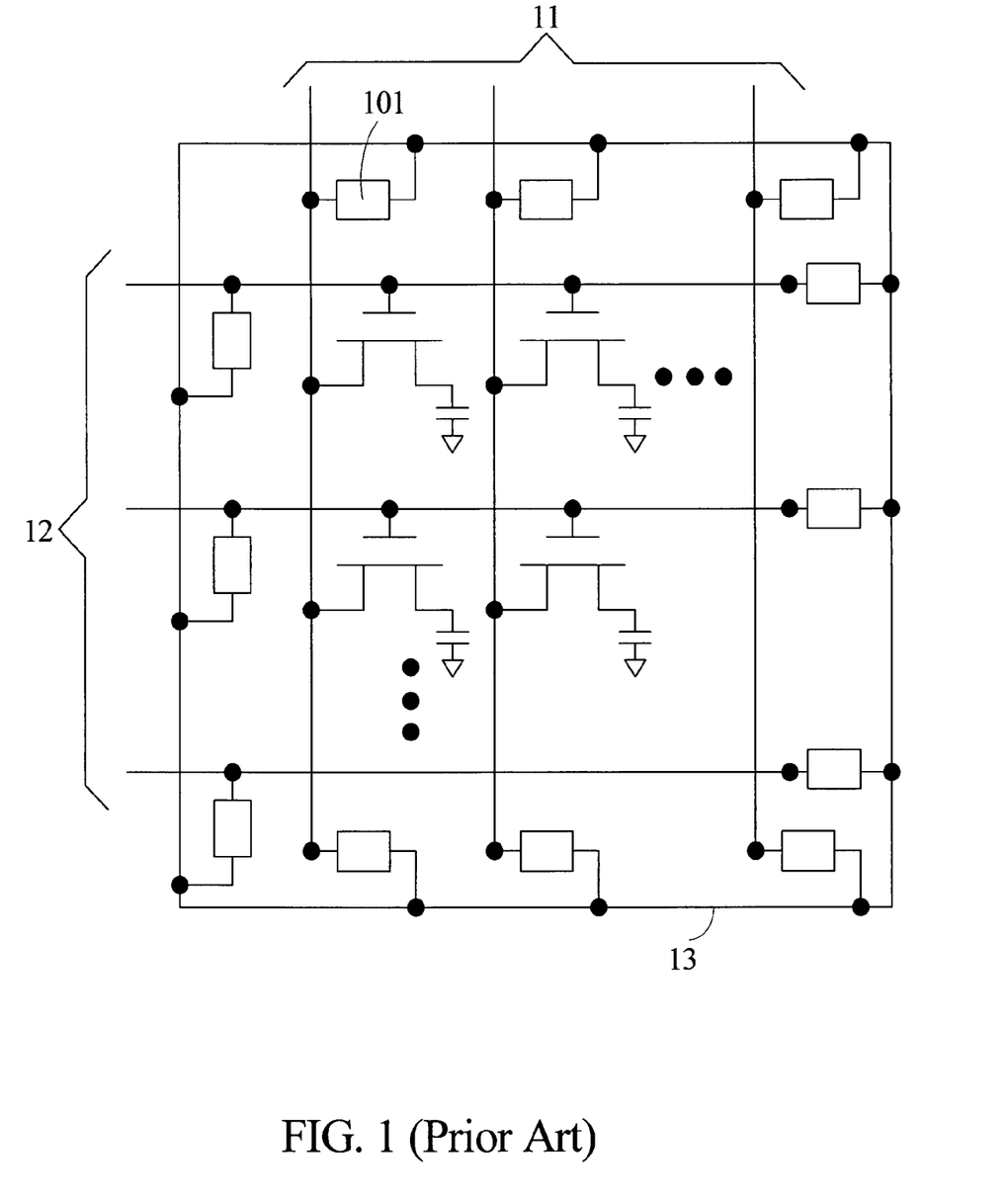
FIG. 1 is a schematic view illustrating a conventional electrostatic discharge protection structure.

To solve problems caused by the electrostatic discharge phenomenon in liquid crystal displays, an electrostatic discharge protection device is conventionally disposed between the conductive wires of the pixel arrays of the liquid crystal display. The liquid crystal display is constructed by many pixel devices arranged in an array, wherein each of the pixel devices comprises a transistor to control the deflection degree of the liquid crystal. The deflection degree allows the liquid crystal to display various levels of brightness while the light generated from a backlight source is transmitted through the pixel device. Currently, a thin-film transistor is frequently used as a control transistor, which can be directly formed onto the glass substrate of the liquid crystal display. Consequently, the thin-film pixel array is formed with the pixel device array. The thin-film pixel array is controlled by a gate bus and a data bus. The gate bus comprises a plurality of conducting wires and each conducting wire connects with a plurality of thin-film transistor gates. Similarly, the data bus connects with a plurality of source/drains of the thin-film transistors. Each of the electrostatic discharge protection devices is disposed on each of the conducting wires as shown in FIG. 1. FIG. 1 shows a schematic view illustrating a conventional electrostatic discharge protection structure, wherein a data bus 11 connects to the source/drains of the thin-film transistors to write data therein, and a gate bus 12 connects to the gates of the thin-film transistors to turn-on or turn-off the thin-film transistors. FIG. 1 only shows the portion of the thin-film transistors in the thin-film pixel array. In this structure, each conducting wire of the data bus 11 and the gate bus 12 connects to an electrostatic discharge protection bus 13 through an electrostatic discharge protection device 101. It is noted that both ends of each conducting wire connects to the electrostatic discharge protection bus through the electrostatic discharge protection device 101.

Unfortunately, the conventional electrostatic discharge protection structure still has its drawbacks. With technological advances, drive circuits have been integrated with thin-film transistors. In other words, the drive circuit and the thin-film transistors are formed on the same substrate. With this integration, the conventional structure can not provide electrostatic discharge protection for the drive circuit, resulting in damage to the drive circuit on the display.

Furthermore, when the turn-on voltage of the designed electrostatic discharge protection devices is not high enough, the working voltage applied to the thin-film transistors during the panel of the display being lighted up will cause the current of the electrostatic discharge protection devices which connect with the thin-film transistors to leak. Because conventional electrostatic discharge protection structures dispose a large amount of electrostatic discharge protection devices around the thin-film pixel array, the current leakage will affect the normal operation of the display. When the conduction voltage of the electrostatic discharge protection device is excessively high, damage will occur to the devices on the display during electrostatic discharge due to the discharge current flowing through high resistance paths without an effective release of energy.

According to the aforementioned descriptions, an electrostatic discharge protection structure that not only is capable of protecting a liquid crystal display with an integrated drive circuit and thin-film transistor, but also can maintain normal operation during the current leakage of the electrostatic discharge protection device, is needed. Consequently, an integrated electrostatic discharge protection structure with electrostatic discharge protection devices and low current leakages needs to be developed in this field.

SUMMARY OF THE INVENTION

The primary objective of this invention is to provide an electrostatic discharge protection structure for use in a liquid crystal display with a thin-film pixel array and drive circuit. The electrostatic discharge protection structure comprises an electrostatic discharge bus, a plurality of first electrostatic discharge protection devices, a plurality of second electrostatic discharge protection devices, and a plurality of third electrostatic discharge protection devices. The first electrostatic discharge protection devices connect to the gates of the thin-film transistors and the electrostatic discharge bus. The second electrostatic discharge protection devices connect to the source/drains of the thin-film transistors and the electrostatic discharge bus. The third electrostatic discharge protection devices connect to the input/output terminals of the drive circuit and the electrostatic discharge bus. The thin-film pixel array comprises a plurality of gate lines to connect the gates of the thin-film transistors, and a plurality of data lines to connect the source/drains of the thin-film transistors. The drive circuit connects with the gate lines and the data lines.

Another objective of this invention is to provide an electrostatic discharge protection device for use in a liquid crystal display with a thin-film pixel array. The electrostatic discharge protection device comprises a glass substrate, a semiconductor substrate formed on the glass substrate, a first doping region, a second doping region, a third doping region, and a fourth doping region. The first, second, third and fourth doping regions are formed within the semiconductor substrate in series, in which the first, second, third and fourth doping regions can be one of a P-type doping region, an N-type doping region, and an intrinsic region, individually. Two adjacent doping regions are also of different types.

Yet another objective of the invention is to provide a method for manufacturing an electrostatic discharge protection device for use in a liquid crystal display with a thin-film pixel array. The method comprises the following steps: forming a semiconductor substrate on the glass substrate; defining the first, second, third and fourth doping regions within the semiconductor substrate; and doping the first, second, third and fourth doping regions into one of a P-type doping region, an N-type doping region, and an intrinsic region, individually, wherein two adjacent doping regions are of different types.

The invention not only protects the liquid crystal display, which has an integrated drive circuit and thin-film transistor, but also prevents the current leakage of the electrostatic discharge protection devices from affecting the normal operation of the display.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 2:
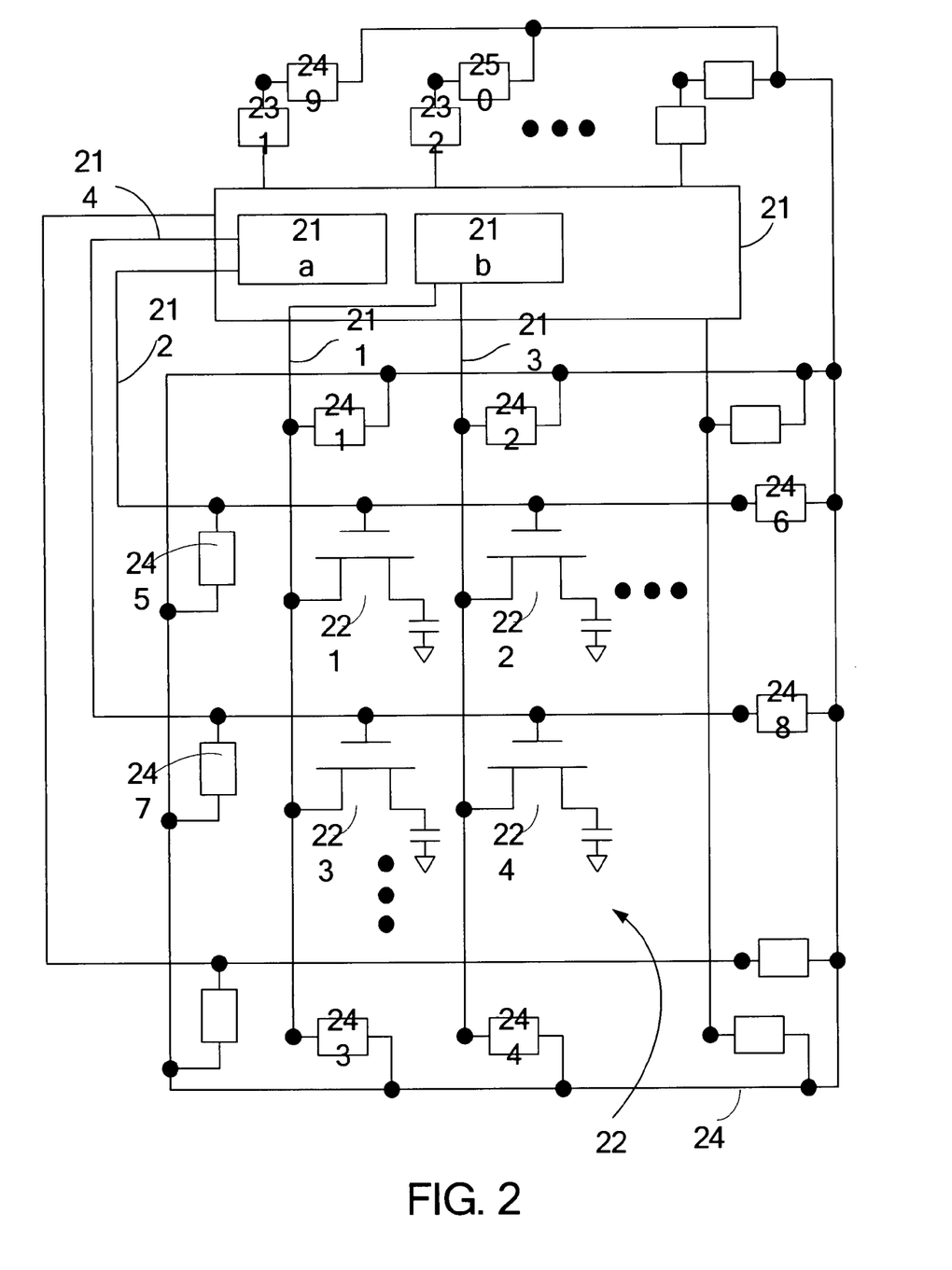
FIG. 2 illustrates the first embodiment of the present invention.

FIG. 2 shows the first embodiment of the present invention which provides an electrostatic discharge protection structure located between a drive circuit 21 and a pixel array 22 which are integrated. Each output terminal of the drive circuit connects to a gate and a source/drain of each thin-film transistor in the pixel array 22, respectively. In FIG. 2, a schematic view only illustrating the connection between the pixel array 22 and the drive circuit 21 is shown. A data line 211 connects to the source/drains of the thin-film transistors arranged in a column in the pixel array. In FIG. 2, only a portion of a thin-film transistor 221 and a thin-film transistor 223 connecting to the data line 211 is shown. Similarly, the source/drains of thin-film transistors 222 and 224 connect to a data line 213. Gates of the thin-film transistor 221 and the thin-film transistor 222 connect to the gate line 212. Gates of the thin-film transistor 223 and the thin-film transistor 224 connect to the gate line 214. These data lines and gate lines are all outputs of the drive circuit 21. Meanwhile, the drive circuit 21 comprises a plurality of input/output terminals. More specifically, the drive circuit 21 comprises a gate driver 21a and a data driver 21b, in which the gate driver 21a electrically connects to the gate lines 212, 214 and the data driver 21b electrically connects to the data lines 211, 213, respectively. Only a portion of the input/output terminals are shown in FIG. 2, such as input/output terminals 231 and 232.

In the first embodiment, the electrostatic discharge protection devices of the electrostatic discharge protection structure are disposed on all data lines, gate lines and input/output terminals. For example, electrostatic discharge protection devices 241 and 243 are connected with the data line 211, electrostatic discharge protection devices 242 and 244 are connected with the data line 213, electrostatic discharge protection devices 245 and 246 are connected with the gate line 212, electrostatic discharge protection devices 247 and 248 are connected with the gate line 214, an electrostatic discharge protection device 249 is connected with the input/output terminal 231, and an electrostatic discharge protection device 250 is connected with the input/output terminal 232. All of the electrostatic discharge protection devices are connected to an electrostatic discharge protection bus 24.

By connecting to the electrostatic discharge protection bus 24, the display with the integrated drive circuit 21 and the pixel array 22 can prevent the energy of the electrostatic discharge from damaging the drive circuit and the pixel array devices on the display. The electrostatic discharge protection device suitable for the electrostatic discharge protection structure can be a thin-film diode, a thin-film transistor (such as a diode-equivalent TFT), a coupling thin-film transistor (coupling TFT) or a thin-film silicon-controlled-rectifier (TF-SCR).

Figure 3:
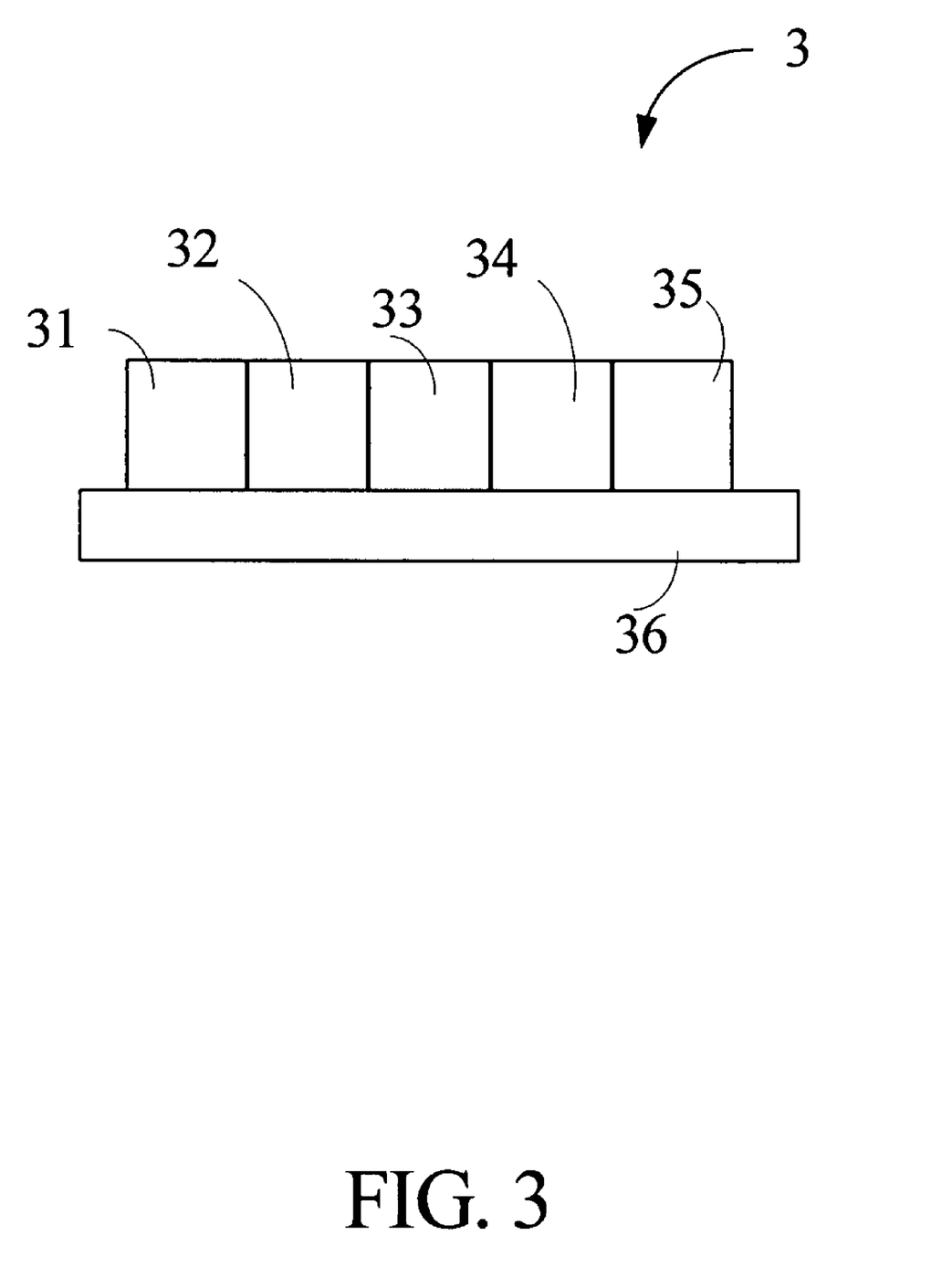
FIG. 3 illustrates the second embodiment of the present invention.

FIG. 3 shows the second embodiment of the present invention which utilizes a TF-SCR 3 as an infrastructure of the electrostatic discharge protection device of the electrostatic discharge protection structure in the liquid crystal display. Since the snap-back trigger voltage can be designed to be greater than the normal working voltage of the liquid crystal display, the working voltage applied to the thin-film transistor by the liquid crystal display will not trigger the TF-SCR 3 to generate a snap-back effect. This can prevent the current leakage from being generated that affects the operation of the liquid crystal display.

When the electrostatic discharge phenomenon occurs, its high voltage will be greater than the snap-back trigger voltage of the TF-SCR 3. As a result of the snap-back breakdown of the TF-SCR 3, the discharge voltage is decreased to the conduction voltage of the TF-SCR 3. This decrease allows the voltage to enter the low resistance operation region which is capable of sustaining a higher electrostatic discharge current under the same impact of the electrostatic discharge energy. As a result, the high current generated by electrostatic discharge is guided away from the liquid crystal display to achieve the protection objective.

The TF-SCR 3 in FIG. 3 comprises a P+ doping region 31, an N– doping region 32, a P+ doping region 33, an N– doping region 34, and an N+ doping region 35. The doping regions are commonly formed on a glass substrate 36, while the doping regions are formed in a semiconductor substrate. The semiconductor substrate can be an amorphous silicon layer or a low temperature poly silicon layer. An electrostatic discharge protection device comprises two TF-SCRs 3 with inverse conduction directions. Because the electrostatic discharge may occur at any end of the electrostatic discharge protection device, two TF-SCRs 3 with inverse conduction directions provide bidirectional electrostatic discharge paths.

Figure 4A:
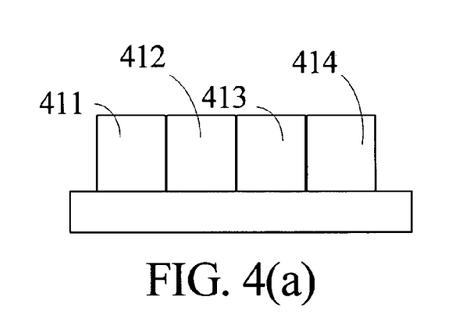
FIG. 4(a) to FIG. 4(e) are schematic views illustrating the doping regions of the thin-film silicon-controlled-rectifier (TF-SCR)
Figure 4B:
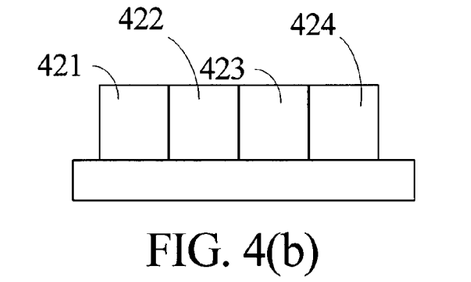
Figure 4C:
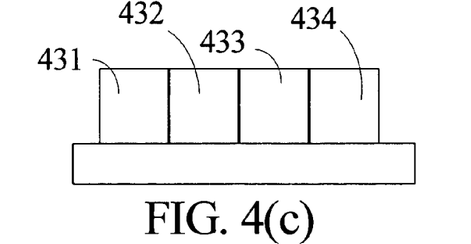
Figure 4D:
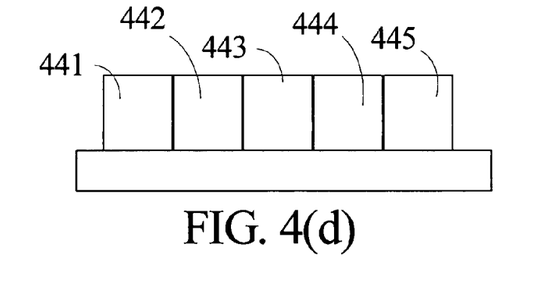
Figure 4E:
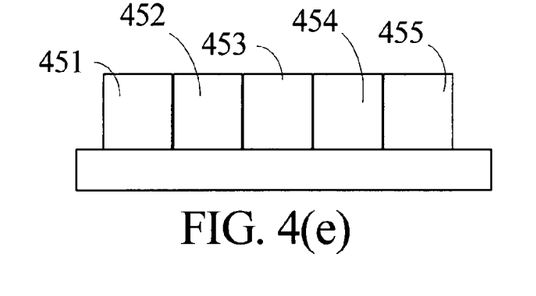

The TF-SCR has many equivalent structures which comprise at least four doping regions in series. The doping regions can individually be one of a P-type doping region, an N-type doping region and an intrinsic region, wherein two adjacent doping regions are of different types. FIGS. 4(a) to 4(e) show schematic views of equivalent structures of the TF-SCR doping regions. The equivalent structures are all formed on the glass substrate, wherein FIG. 4(a) illustrates a P+ doping region 411, an N− doping region 412, a P− doping region 413, and an N+ doping region 414; FIG. 4(b) illustrates a P+ doping region 421, an N− doping region 422, an intrinsic doping region 423, and an N+ doping region 424; FIG. 4(c) illustrates a P+ doping region 431, an intrinsic doping region 432, a P− doping region 433, and an N+ doping region 434; FIG. 4(d) illustrates a P+ doping region 441, an N− doping region 442, an intrinsic doping region 443, an N− doping region 444, and an N+ doping region 445; FIG. 4(e) illustrates a P+ doping region 451, an intrinsic doping region 452, a P+ doping region 453, an intrinsic doping region 454, and an N+ doping region 455.

It is noted that FIG. 4(a) to FIG. 4(e) are illustrated as examples. People skilled in the art can refer to the aforementioned disclosures to understand and practice other equivalent structures of the TF-SCR.

Figure 5A:
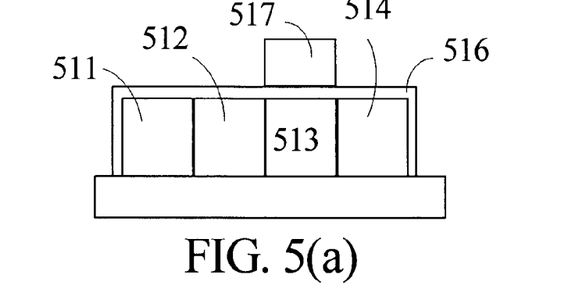
FIG. 5(a) to FIG. 5(d) are schematic views illustrating equivalent structures of the TF-SCR.
Figure 5B:
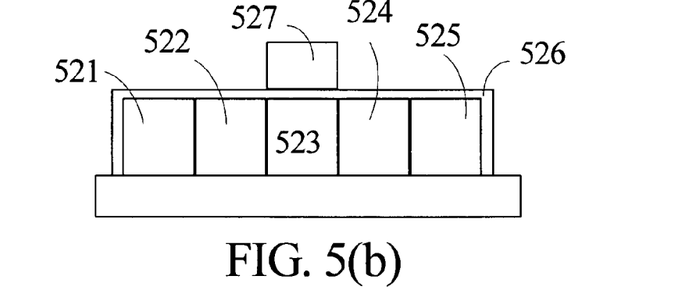

FIGS. 5(a) to 5(d) show schematic views of equivalent structures of a TF-SCR that have an insulating layer and a metallic gate, wherein the insulating layer is used for insulating the gate and doping region. FIG. 5(a) shows a P+ doping region 511, an N− doping region 512, a P− doping region 513, an N+ doping region 514, an insulating layer 516 and a metallic gate 517. For a TF-SCR, the metallic gate is located above the P− doping region 513. After the metallic gate is defined, the whole amorphous silicon layer can be formed by the N− carrier doping. At this time, the gate metal blocks the P− doping region 513 from being affected by the N− carrier doping. As a result, the mask for the N− doping region 512 can be saved. Similarly, FIG. 5(b) illustrates a P+ doping region 521, an N− doping region 522, an intrinsic doping region 523, an N− doping region 524, an N+ doping region 525, an insulating layer 526 and a metallic gate 527, wherein the metallic gate 527 is formed above the intrinsic doping region 523 for purposes of saving the masks of the N− doping regions 522 and 524.

Figure 5C:
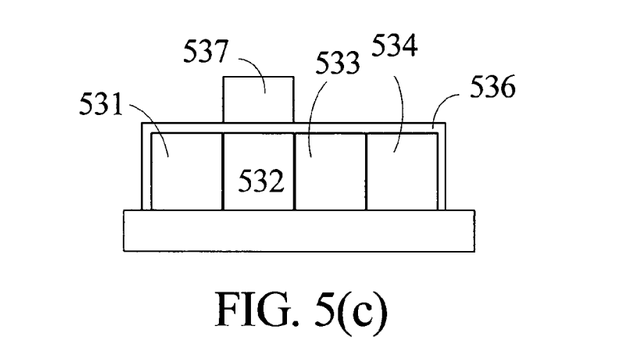
Figure 5D:
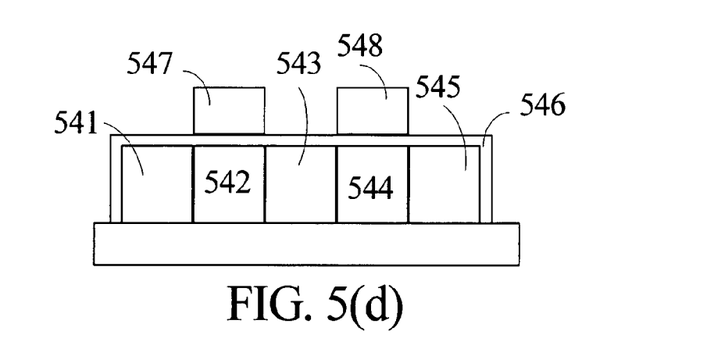

Similar structures can be applied for saving the masks for P− doping regions. FIG. 5(c) shows a P+ doping region 531, an intrinsic doping region 532, a P− doping region 533, an N+ doping region 534, an insulating layer 536 and a metallic gate 537. For a TF-SCR, the metallic gate is located above the intrinsic doping region 532. After the metallic gate is defined, the whole amorphous silicon layer can be formed by P− carrier doping. At this time, the gate metal blocks the intrinsic doping region 532 from being affected by the P− carrier doping. As a result, the mask for the P− doping region 533 can be saved. FIG. 5(d) illustrates a P+ doping region 541, an intrinsic doping region 542, a P− doping region 543, an intrinsic doping region 544, an N+ doping region 545, an insulating layer 546 and metallic gates 547 and 548, wherein the metallic gates 547 and 548 are formed above the intrinsic doping region 542 and 544, respectively, for the purpose of saving the masks of the P− doping region 543.

Figure 6:
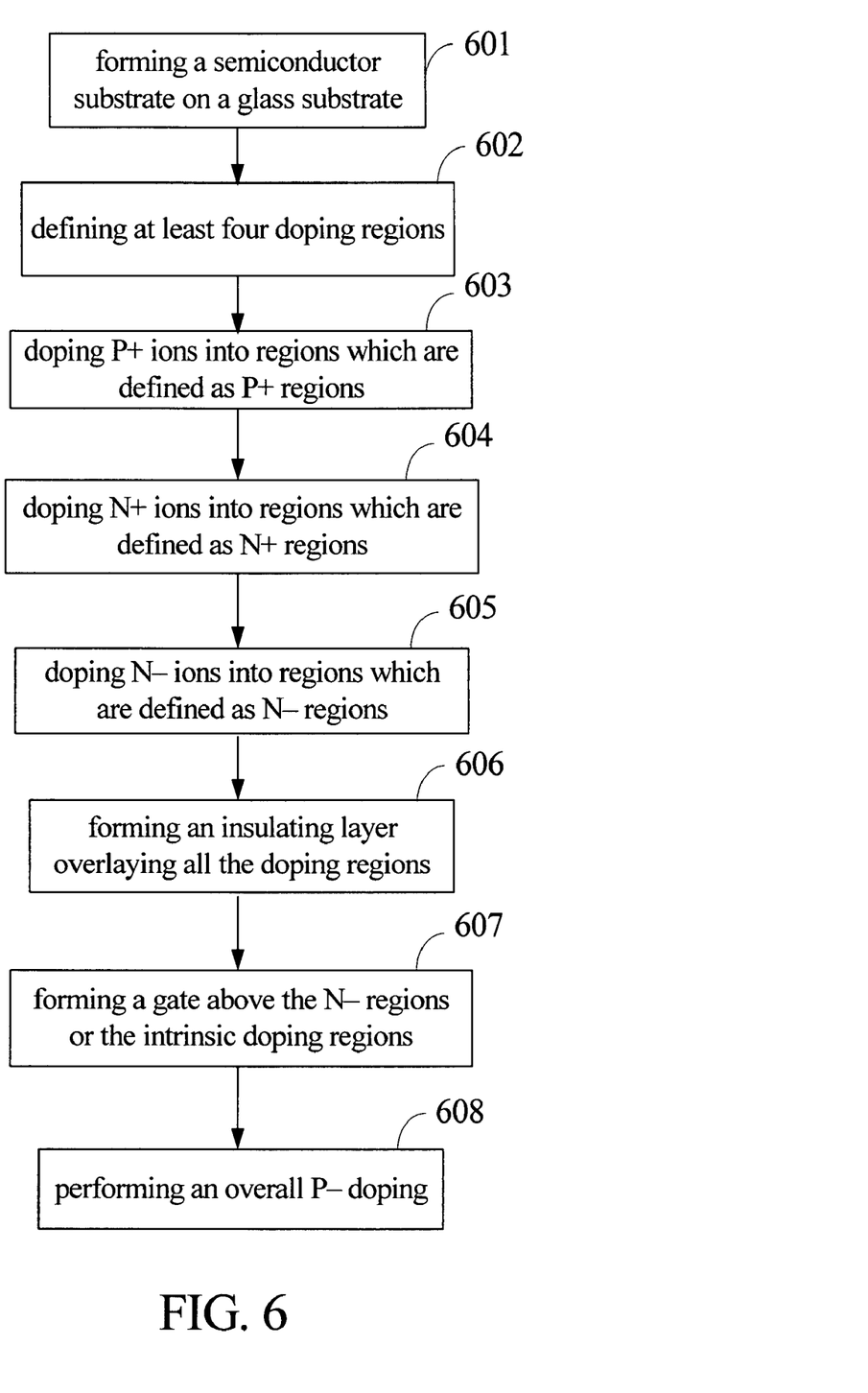
FIG. 6 illustrates the third embodiment of the present invention.

FIG. 6 illustrating the manufacturing method for forming an electrostatic discharge protection device shows the third embodiment of the present invention. In step 601, a semiconductor substrate is formed on the glass substrate. Next, step 602 is executed to define at least four doping regions within the semiconductor layers, wherein two adjacent doping regions are of different types. Next, step 603 is executed to dope P+ ions into regions which are defined as P+ regions. Step 604 is executed to dope N+ ions into regions which are defined as N+ regions. Step 605 is then executed to dope N− ions into regions which are defined as N− regions. Step 606 is executed to form an insulating layer overlaying all the doping regions. Step 607 is executed to form a gate above the N− regions or the intrinsic doping regions. Step 608 is executed to perform an overall P− doping.

The N− ions in step 605 can be substituted by the P− ions. Correspondingly, the N− region in step 607 is substituted by the P− region, while the P− ions in the step 608 is substituted by the N− ions. The aforementioned ordering for each step is for illustrative purposes only and is not intended to limit the scope of the invention. For example, step 604 can be executed prior to step 603.

According to the aforementioned descriptions, the invention not only protects the liquid crystal display, which has an integrated drive circuit and thin-film transistor, but also prevents the current leakage of the electrostatic discharge protection devices from affecting the normal operation of the display.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An electrostatic discharge protection structure for use in a liquid crystal display having a pixel array and a plurality of drive circuits, the pixel array having a plurality of thin-film transistors each having a gate, a source and a drain, a plurality of gate lines, each electrically connected to the gate of the corresponding transistor, and a plurality of data lines each electrically connected to the source/drain of the corresponding transistor, each drive circuit having an input/output terminal electrically connected to the gate lines and the data lines, the electrostatic discharge protection structure comprising:

an electrostatic discharge bus;

a plurality of first electrostatic discharge protection devices, each first discharge protection device being electrically connected to the gate of the corresponding transistor and the electrostatic discharge bus;

a plurality of second electrostatic discharge protection devices, each second electrostatic discharge protection devices being electrically connected to the source/drain of the corresponding transistor and the electrostatic discharge bus; and a plurality of third electrostatic discharge protection devices, each third electrostatic discharge protection devices being electrically connected to the input/output terminals of the corresponding drive circuit and the electrostatic discharge bus;

wherein each of the first, second and third electrostatic discharge protection devices comprising a glass substrate and a semiconductor substrate formed on the glass substrate, the semiconductor substrate being formed with a first, a second, a third and a fourth doping regions, which are formed within the semiconductor substrate in series, each being one of a P-type doping region, an N-type doping region and an intrinsic region, and two of the adjacent doping regions are of different types.

2. The electrostatic discharge protection structure as claimed in claim 1, wherein each of the first, second and third electrostatic discharge protection devices comprises a thin-film silicon-controlled-rectifier (TF-SCR).

3. The electrostatic discharge protection structure as claimed in claim 1, wherein each of the electrostatic discharge protection devices further comprises:
   a metallic gate; and
   an insulating layer, formed between the metallic gate and the first, second, third and fourth doping regions for insulating the metallic gates from the first, second, third and fourth doping regions;
   wherein the metallic gate is disposed above at least one of the first, second, third and fourth doping regions.

4. The electrostatic discharge protection structure as claimed in claim 1, wherein the semiconductor substrate comprises an amorphous silicon layer or a low temperature poly silicon layer.

5. A method for manufacturing an electrostatic discharge protection device for use in a liquid crystal display having a thin-film pixel array, the method comprising:
   forming a semiconductor substrate on a glass substrate;
   defining a first, a second, a third and a fourth doping regions on the semiconductor substrate; and
   doping the first, second, third and fourth doping regions so as to form at least one of a P-type doping region, an N-type doping region, and an intrinsic region; wherein the two adjacent doping regions are of different types.

6. The method as claimed in claim 5, wherein the semiconductor substrate comprises an amorphous silicon layer or a low temperature poly silicon layer.

7. The method as claimed in claim 5, further comprising:
   forming an insulating layer covering the first, second, third and fourth doping regions; and
   forming a gate above the insulating layer.

8. The method as claimed in claim 7, wherein the gate is made of a conductive material.

* * * * *